United States Patent
Parikh et al.

(10) Patent No.: US 9,437,479 B2
(45) Date of Patent: Sep. 6, 2016

(54) METHODS FOR FORMING AN INTERCONNECT PATTERN ON A SUBSTRATE

(71) Applicant: APPLIED MATERIALS, INC., Santa Clara, CA (US)

(72) Inventors: Suketu A. Parikh, San Jose, CA (US); Mehul Naik, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/523,302

(22) Filed: Oct. 24, 2014

(65) Prior Publication Data

US 2015/0140805 A1    May 21, 2015

Related U.S. Application Data

(60) Provisional application No. 61/906,195, filed on Nov. 19, 2013.

(51) Int. Cl.
*H01L 21/4763* (2006.01)
*H01L 21/768* (2006.01)

(52) U.S. Cl.
CPC ..... *H01L 21/76802* (2013.01); *H01L 21/7682* (2013.01); *H01L 21/7684* (2013.01); *H01L 2221/1047* (2013.01)

(58) Field of Classification Search
CPC ............... H01L 21/76802; H01L 21/76843; H01L 21/76877
USPC ................................................ 438/618–630
See application file for complete search history.

(56) References Cited

U.S. PATENT DOCUMENTS

| | | | |
|---|---|---|---|
| 5,488,015 A | 1/1996 | Havemann et al. | |
| 6,127,263 A | 10/2000 | Parikh | |
| 6,660,619 B1 | 12/2003 | Pangrle et al. | |
| 6,842,659 B2 | 1/2005 | Parikh et al. | |
| 2003/0186538 A1 | 10/2003 | Lee et al. | |
| 2007/0049035 A1* | 3/2007 | Tran | H01L 21/0337 438/696 |
| 2007/0049040 A1* | 3/2007 | Bai | H01L 21/0337 438/712 |
| 2007/0264830 A1* | 11/2007 | Huang | H01L 21/0337 438/694 |
| 2008/0099923 A1 | 5/2008 | Kumar et al. | |

FOREIGN PATENT DOCUMENTS

JP    H 10-256363 A    9/1999

OTHER PUBLICATIONS

International Search Report and Written Opinion mailed Jan. 28, 2015 for PCT Application No. PCT/US2014/062669.

* cited by examiner

*Primary Examiner* — H Tsai
(74) *Attorney, Agent, or Firm* — Moser Taboada; Alan Taboada

(57) ABSTRACT

Embodiments of methods for forming interconnect patterns on a substrate are provided herein. In some embodiments, a method for forming an interconnect pattern atop a substrate includes depositing a porous dielectric layer atop a cap layer and a plurality of spacers disposed atop the cap layer, wherein the cap layer is disposed atop a bulk dielectric layer and the bulk dielectric layer is disposed atop a substrate; removing a portion of the porous dielectric layer; removing the plurality of spacers to form features in the porous dielectric layer; and etching the cap layer to extend the features through the cap layer.

18 Claims, 5 Drawing Sheets

METHODS FOR FORMING AN INTERCONNECT PATTERN ON A SUBSTRATE

FIELD

Embodiments of the present disclosure generally relate to semiconductor fabrication processes.

BACKGROUND

Conventional processes used to form interconnect structures typically include a number of cycles of deposition of a patterning template (e.g., photoresist, hard mask, liner, or the like) followed by one or more etch processes. For example, a conventional process may include deposition of a masking layer followed by multiple etch processes to create features (e.g., trenches and vias) in an underlying layer disposed atop a substrate (e.g., a dielectric layer) to form an interconnect pattern. However, the inventors have observed that performing multiple etch processes may result in an uneven and non-uniform profile of the features in the interconnect pattern. In addition, the inventors have observed that the multiple etch processes may cause a degradation in the structural integrity of the features, undesirably resulting in a collapsing of the features during subsequent deposition processes (e.g., a metal fill).

Therefore, the inventors have provided an improved method for forming an interconnect pattern atop a substrate.

SUMMARY

Embodiments of methods for forming interconnect patterns on a substrate are provided herein. In some embodiments, a method for forming an interconnect pattern atop a substrate includes depositing a porous dielectric layer atop a cap layer and a plurality of spacers disposed atop the cap layer, wherein the cap layer is disposed atop a bulk dielectric layer and the bulk dielectric layer is disposed atop a substrate; removing a portion of the porous dielectric layer; removing the plurality of spacers to form features in the porous dielectric layer; and etching the cap layer to extend the features through the cap layer.

In some embodiments, a method for forming an interconnect pattern atop a substrate includes: depositing a porous dielectric layer atop a cap layer and a plurality of spacers disposed atop the cap layer such that one or more voids are formed within the porous dielectric layer, wherein the cap layer is disposed atop a bulk dielectric layer and the bulk dielectric layer is disposed atop a substrate; selectively depositing a photoresist layer atop the porous dielectric layer atop an area of the porous dielectric layer where no features are to be formed in the porous dielectric layer; removing a portion of the porous dielectric layer through the photoresist layer; removing the plurality of spacers to form features in the porous dielectric layer; and etching the cap layer to extend the features through the cap layer.

In some embodiments, a computer readable medium, having instructions stored thereon that, when executed, cause a method for forming an interconnect pattern atop a substrate to be performed, wherein the method includes depositing a porous dielectric layer atop a cap layer and a plurality of spacers disposed atop the cap layer, wherein the cap layer is disposed atop a bulk dielectric layer and the bulk dielectric layer is disposed atop a substrate; removing a portion of the porous dielectric layer; removing the plurality of spacers to form features in the porous dielectric layer; and etching the cap layer to extend the features through the cap layer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
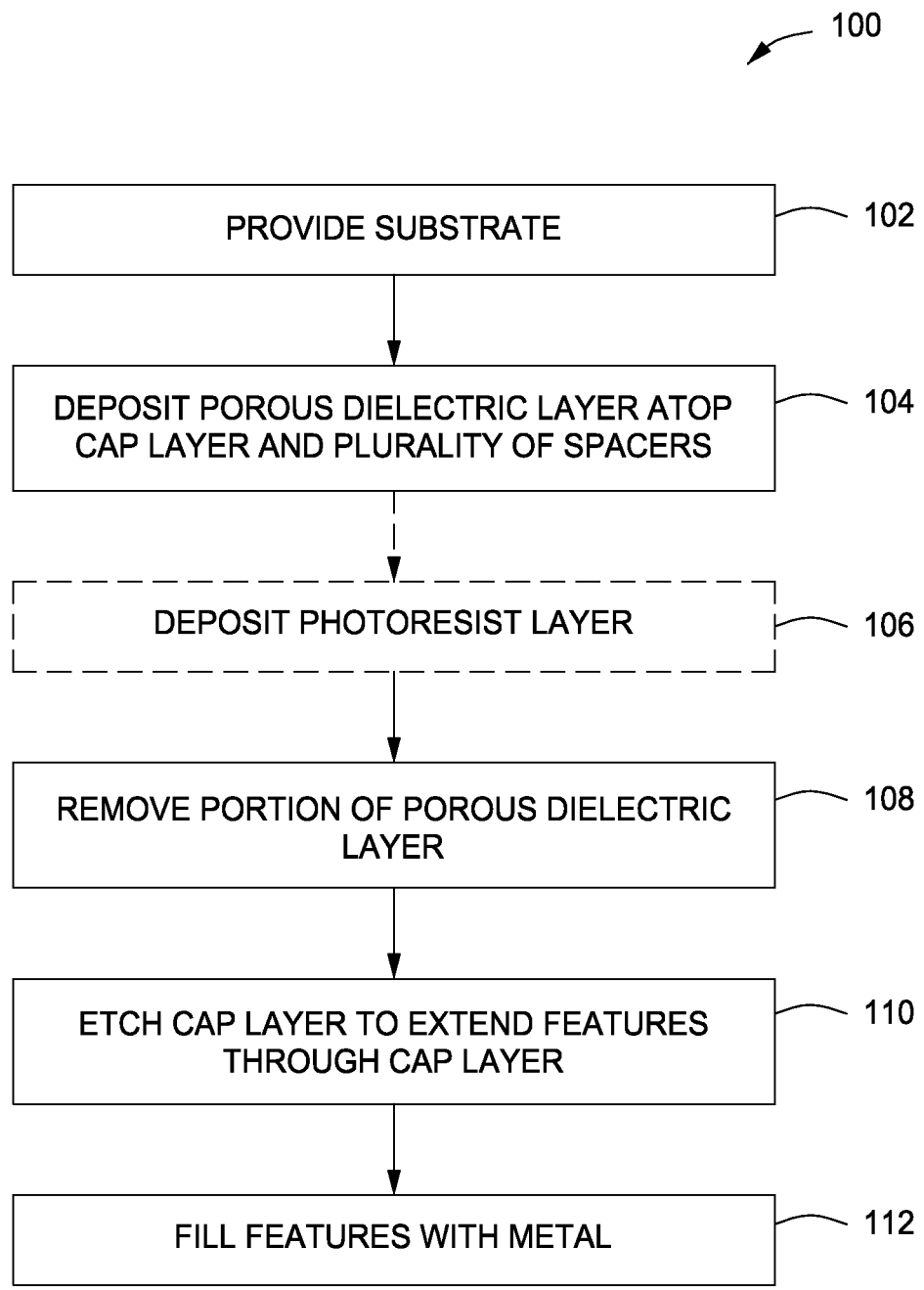
FIG. 1 shows a method for forming an interconnect pattern atop a substrate in accordance with at least some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods for forming interconnect patterns on a substrate are provided herein. In at least some embodiments, the inventive method may advantageously facilitate the formation of features within a porous dielectric layer while not causing damage to the porous dielectric layer that would result from conventionally utilized feature formation techniques, for example such as one or more etch processes.

FIG. 1 depicts a method for forming an interconnect pattern on a substrate in accordance with some embodiments of the present disclosure. FIGS. 2A-2F depict a portion of a substrate through various stages of the method of FIG. 1 in accordance with some embodiments of the present disclosure.

The method 100 generally begins at 102, where a substrate 200 is provided to a process chamber. The process chamber may be any type of process chamber suitable to perform at least a portion of the method described herein, for example, one or more of the process chambers described below. In some embodiments, more than one process chamber may be utilized to perform separate portions of the method. In such embodiments, the process chambers may be standalone process chambers or part of an integrated tool (e.g., a cluster tool), for example, such as the integrated tool shown in FIG. 3.

The substrate may be any type of substrate suitable for semiconductor device fabrication. For example, referring to FIG. 2, the substrate 200 may be a silicon substrate, for example crystalline silicon (e.g., Si<100> or Si<111>), silicon oxide, strained silicon, doped or undoped polysilicon, or the like, a III-V or II-VI compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like.

In some embodiments, the substrate 200 includes a partially or fully fabricated semiconductor device, for example such as a two dimensional or three dimensional device, such as a multigate device, fin field effect transistor (FinFET), metal oxide semiconductor field effect transistor (MOSFET), nanowire field effect transistor (NWFET), tri-gate transistor, a memory device such as a NAND device or NOR device, or the like.

Figure 2A:
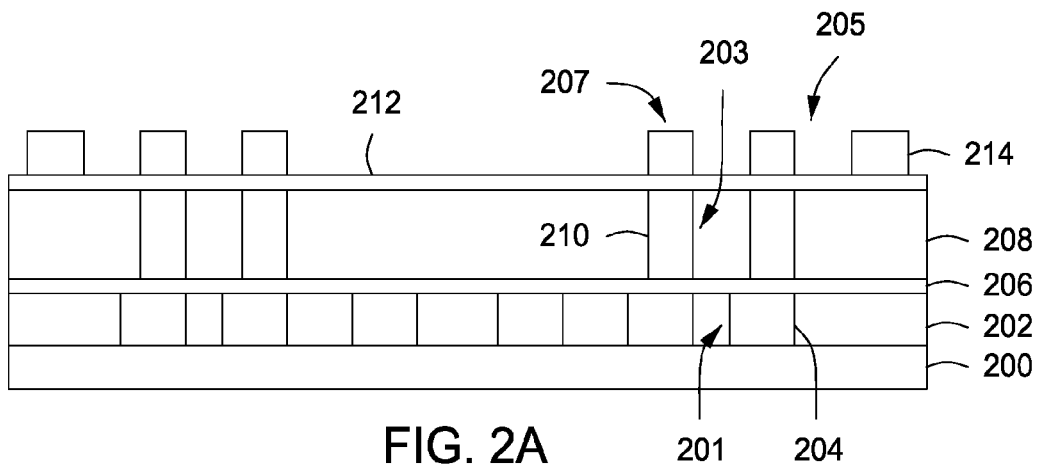
FIGS. 2A-G depict a portion of a substrate in various stages of a method for forming an interconnect pattern atop a substrate in accordance with at least some embodiments of the present disclosure.

In some embodiments, one or more layers are disposed atop the substrate 200. The one or more layers may be any type of layers suitable to facilitate the fabrication of at least a portion of a desired device (e.g., an interconnect structure). For example, in some embodiments, a low-k dielectric layer 202 may be disposed atop the substrate 200, such as shown in FIG. 2A. The low-k dielectric layer 202 may include any low-k dielectric material suitable for semiconductor device fabrication. For example, in some embodiments, the low-k dielectric layer 202 may comprise a silicon containing material, for example, such as silicon oxide ($SiO_2$), a carbon or fluorine doped silicon oxide ($SiO_2$), or the like.

In some embodiments, a conductive layer 204 is disposed within features (second features) 201 formed in the low-k dielectric layer 202 and disposed atop the substrate 200. The conductive layer 204 may include any conductive material suitable to provide sufficient conductivity between the substrate 200 and one or more features of an at least partially fabricated device (e.g., the interconnect structures described herein). For example, in some embodiments, the conductive layer 204 may comprise aluminum (Al), cobalt (Co), copper (Cu) and copper alloys such as with manganese (Mn) and/or tin (Sn), ruthenium (Ru), silver (Ag), tantalum (Ta), tantalum nitride (TaN), titanium (Ti), titanium nitride (TiN), tungsten (W), or the like.

As used herein, when describing the dielectric layers (e.g., the low-k dielectric layer 202, barrier layer 206 and bulk dielectric layer 208) a high-k value may be greater than about 4, a low-k value may be less than about 3.9 (for example, 2.5 to about 3.5), and an ultra low-k dielectric may be less than about 2.5.

In some embodiments, a barrier layer 206 is disposed atop the low-k dielectric layer 202 and the conductive layer 204 (when present). The barrier layer 206 may be formed from any fabrication compatible material sufficient to form a barrier between the low-k dielectric layer 202 and layers disposed above the low-k dielectric layer 202 (e.g., the bulk dielectric layer 208 described below). For example, in some embodiments, the barrier layer 206 comprises a low-k dielectric material (e.g., a barrier low-k (BLoK) layer), for example, a silicon containing material, for example, such as silicon oxide ($SiO_2$), a carbon or fluorine doped silicon oxide ($SiO_2$), or the like.

In some embodiments, a bulk dielectric layer 208 is disposed atop the barrier layer 206. The bulk dielectric layer 208 may be formed from any fabrication compatible material, for example, a low-k dielectric material such as silicon oxide ($SiO_2$), silicon oxynitride (SiON), or the like. In some embodiments, the porosity of the bulk dielectric layer 208 may be varied to reduce the dielectric properties of the bulk dielectric layer 208. For example, in some embodiments, the bulk dielectric layer 208 may have a porous structure, such as a closed porous structure, providing in a film having a dielectric constant of about 1.7 to about 2.5.

In some embodiments, a gap fill material 210 may be disposed in features (third features) 203 formed in the bulk dielectric layer 208 to define one or more vias to be fabricated in the bulk dielectric layer 208. For example, in some embodiments, the gap fill material 210 comprises a dielectric material, for silicon carbon nitride (SiCN), silicon nitride (SiN), silicon oxide (SiO2), silicon oxynitride (SiON), amorphous carbon (C), or the like. In such embodiments, the gap fill material 210 may be selected such that the gap fill material 210 may be selectively etched with respect to the bulk dielectric layer 208 to facilitate etching the gap fill material 210 as described below.

In some embodiments, the gap fill material 210 comprises a metal, for example, tungsten (W), copper (Cu), or the like. In such embodiments, the inventors have observed that in applications where the features 203 formed in the bulk dielectric layer 208 are not aligned with features 205 defined by the spacers 207 (e.g., non-self aligned vias) providing a gap fill material 210 that comprises a metal eliminates a need for additional etch and/or deposition processes to form the interconnect structures as described herein. In some embodiments, the gap fill material 210 comprises an amorphous carbon (C). In some embodiments, the composition of the gap fill material 210 may be selected to provide a desired etch selectivity between the gap fill material 210 and the bulk dielectric layer 208 and/or the barrier layer 206 during one or more etch processes, as described below.

In some embodiments, a cap layer 212 is disposed atop the bulk dielectric layer 208. The cap layer 212 may be may be formed from any fabrication compatible material, for example, a low-k dielectric material such as silicon oxide ($SiO_2$), silicon oxynitride (SiON), silicon oxycarbide (SiOC), or the like. In some embodiments, the composition of the cap layer 212 may be selected to provide a desired etch selectivity between the cap layer 212 and one or more layers disposed atop the (e.g., a porous dielectric layer 216 and/or patterning layer 214 described below) during one or more etch processes, as described below.

In some embodiments, a patterning layer 214 comprising a plurality of spacers 207 that define one or more features 205 may be disposed atop the cap layer 212. The patterning layer 214 may be any fabrication compatible material suitable to provide a template to form one or more features, for example, such as described below. For example, in some embodiments, the patterning layer 214 may comprise amorphous carbon (C). Patterning layer 214 may be formed by single lithographic pattern transfer or by double printing. In some embodiments, an in situ process control/feedforward of one or more deposited film layers, such as each of the deposited film layers (including etching the deposited layers), may be provided to control critical dimensions (CD) and height and to adjust the next process accordingly. In some embodiments, feedback may also be provided to correct for variations in the CD and height if out of control (e.g., outside of a desired tolerance).

Figure 2B:
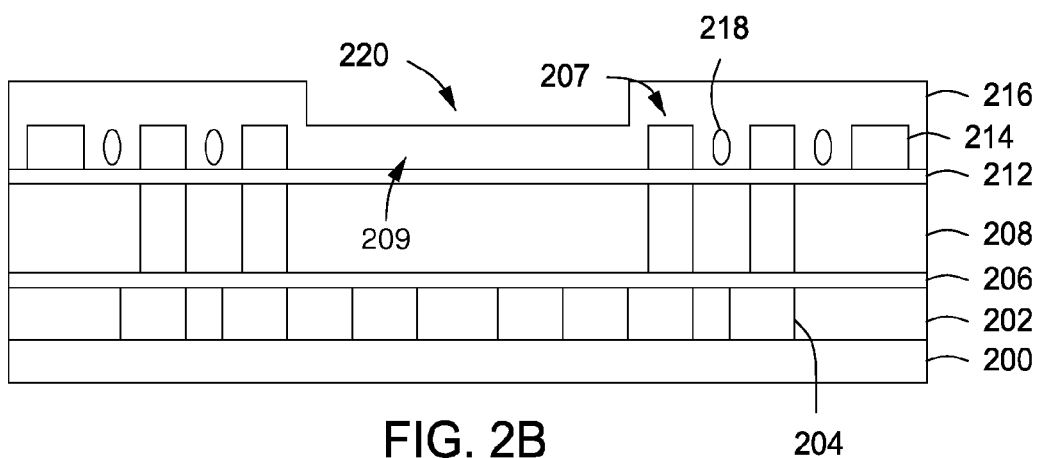
Figure 2C:
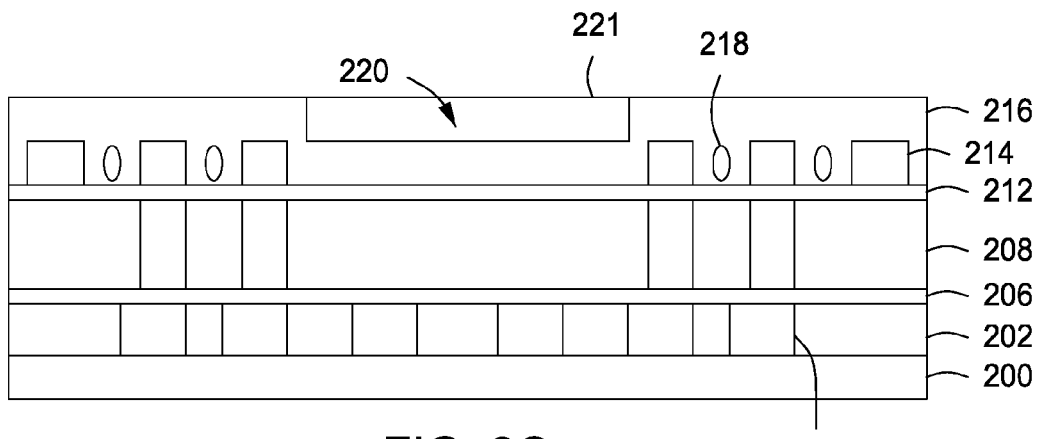

Next, at 104, a porous dielectric layer 216 may be deposited atop the plurality of spacers 207 and the cap layer 212, such as shown in FIG. 2B. The porous dielectric layer 216 may be deposited via any deposition process suitable to deposit the porous dielectric layer 216 for example, such as atomic layer deposition (ALD), chemical vapor deposition (CVD), plasma enhanced CVD (PECVD), spin on coating, or the like, followed by an ultra-violet (UV) or electron beam exposure to cure the deposited film.

The porous dielectric layer 216 may be deposited to any thickness sufficient to cover the plurality of spacers 207. In some embodiments, the porous dielectric layer 216 may be deposited such that the porous dielectric layer 216 has a uniform thickness, or in some embodiments, a varying thickness across the porous dielectric layer 216. In some embodiments, the deposition of the porous dielectric layer 216 may result in, for example, one or more depressions 220 formed in the porous dielectric layer 216 that are disposed above an area 209 where no features are to be formed in the underlying layers (e.g., the barrier layer 206, bulk dielectric layer 208, cap layer 212, or the like).

The porous dielectric layer 216 may comprise any materials having a sufficiently low dielectric constant to provide a desired capacitance across a finished device. For example, in some embodiments, the porous dielectric layer 216 may be a low-k or ultralow-k dielectric layer comprising, for example, silicon oxycarbide (SiOC). In some embodiments, the porosity of the porous dielectric layer 216 may be varied to reduce the dielectric properties of the porous dielectric layer 216. For example, in some embodiments, the porous dielectric layer 216 may have a porous structure, such as a closed porous structure, providing in a film having a dielectric constant of about 1.7 to about 2.5.

The inventors have observed that in some applications, a sufficiently low dielectric constant may not be achieved for conventional materials that may be utilized to form the porous dielectric layer 216 by varying the porosity of the material. Moreover, the inventors have further observed that as porosity of the porous dielectric layer 216 increases, the structural integrity of the porous dielectric layer 216 decreases, which could result in a collapse of the porous dielectric layer 216 during subsequent deposition processes (e.g., a metal fill such as described below) As such, in some embodiments, the one or more voids 218 may be formed in the porous dielectric layer 216 during deposition of the porous dielectric layer 216. The inventors have observed that by forming the one or more voids 218 in the porous dielectric layer 216, the dielectric constant of the porous dielectric layer 216 may be reduced. In addition, the one or more voids 218 may facilitate decreasing the dielectric constant of the porous dielectric layer 216 while not significantly decreasing the structural integrity of the porous dielectric layer 216.

The one or more voids 218 may be of any shape suitable to lower the dielectric constant to a desired magnitude, while providing sufficient structural stability to the porous dielectric layer 216. For example, in some embodiments, the one or more voids 218 may have a cross sectional shape that is an irregular shape, or a regular shape, such as circle, oval, square, keyhole, or the like. The one or more voids 218 may be formed via any process suitable to create the one or more voids 218 while forming the porous dielectric layer 216. For example, in some embodiments, the one or more voids 218 may be formed by varying the deposition rate of the porous dielectric layer 216 and/or by controlling the amount of overhang during the deposition of the porous dielectric layer 216. Alternatively, or in combination with, in some embodiments, the one or more voids 218 may be formed by performing a series of alternating etch and deposition processes. For example, a portion of the porous dielectric layer 216 may be deposited, followed by a deposition of an oxide layer (e.g., silicon oxide, aluminum oxide, or the like). The oxide layer may then be etched away and an additional portion of the porous dielectric layer 216 may be subsequently deposited. This process may repeat as many times as desired to form the porous dielectric layer 216 having the one or more voids 218.

Figure 2D:
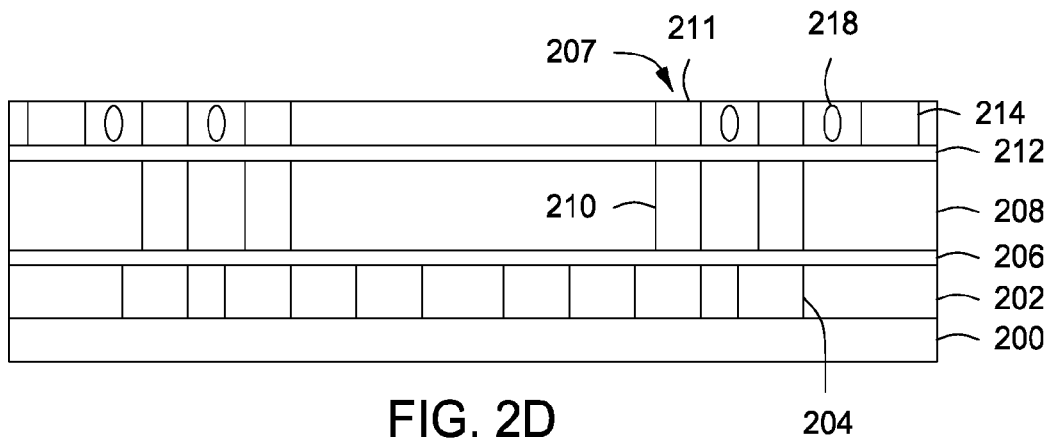
Figure 2E:
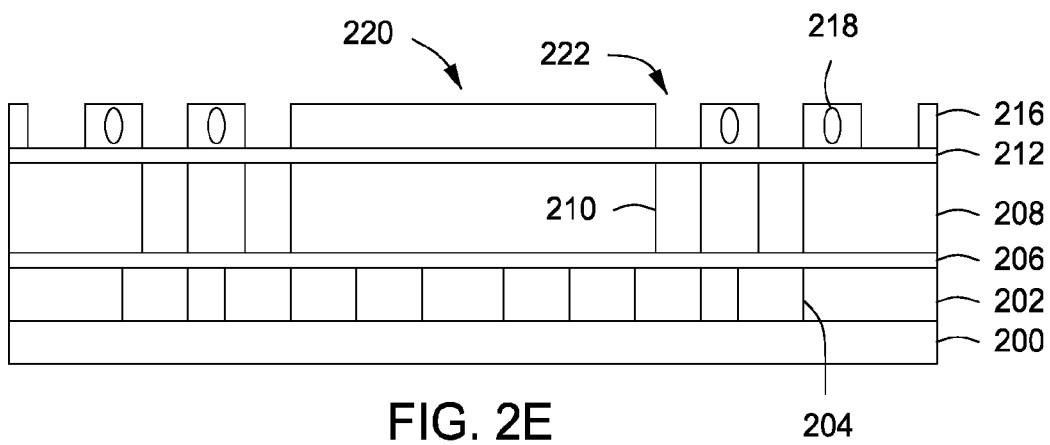

In some embodiments, next, at 106, a photoresist layer 221 may be optionally deposited atop the porous dielectric layer 216, such as shown in FIG. 2E. In such embodiments, the photoresist layer 221 is deposited within the one or more depressions 220 formed in the porous dielectric layer 216. By depositing the photoresist layer 221 in the one or more depressions 220, overetching, and therefore, damage to the underlying layers, may be prevented in subsequent etch processes, for example such as the etch process described below.

The photoresist layer 221 may comprise any suitable photoresist, such as a positive or negative photoresist that may be formed and patterned in any suitable manner, for example, via optical lithography techniques using light such as i-line (e.g., about 365 nm wavelength), g-line (e.g., about 436 nm wavelength), ultraviolet (UV), deep ultraviolet (DUV) or extreme ultraviolet (EUV), contact printing techniques, or the like. In some embodiments, the composition of the photoresist layer 221 may be selected such that the photoresist layer 221 and the porous dielectric layer 216 may be etched or removed at a substantially equivalent rate during a subsequent removal process (e.g., such as described below at 108).

Next, at 108, a portion of the porous dielectric layer 216 may be removed, such as shown in FIG. 2D. By removing the portion of the porous dielectric layer 216, a top 211 of the spacers 207 is exposed, advantageously allowing the spacers 207 to be removed in a subsequent etch process (e.g., the etch process as described below). In embodiments where a photoresist layer (e.g., photoresist layer 221) is deposited atop the porous dielectric layer 216 (e.g., such as described above at 106), the photoresist layer may be removed simultaneously with the portion of the porous dielectric layer 216.

The portion of the porous dielectric layer 216 may be removed via any process that is suitable to remove the desired portion of the porous dielectric layer 216 (and photoresist layer, when present) and which may be dependent on the composition of the porous dielectric layer 216 and/or the photoresist layer 221. For example, in some embodiments, the desired portion of the porous dielectric layer 216 and optional photoresist layer 221 may be removed via, for example, a chemical mechanical planarization (CMP) process, an etch process, a combination thereof or the like.

Next, at 110, the spacers 207 are removed to form features 222 in the porous dielectric layer 216. The spacers 207 may be removed via any process suitable to remove the spacers 207 while not increasing a width of the size of the features 222, for example, such as a wet or dry etch, or by exposing the spacers to a hydrogen containing vapor (e.g., hydrogen ($H_2$), water ($H_2O$), or the like). For example, in some embodiments, an etch process may be performed that selectively etches the spacers 207 while not etching any portion of the porous dielectric layer 216.

The inventors have observed that conventional processes utilized to form features in some applications (e.g., the formation of an interconnect pattern) typically include a series of deposition and etch steps. For example, a patterned masking layer may be deposited atop a dielectric layer (e.g., the porous dielectric layer 216) to define one or more features. The dielectric layer may then be etched through the patterned masking layer to form the features within the dielectric layer. This process may be repeated a number of times to form a desired number of features. However, the inventors have observed that, etching the dielectric layer causes damage to the dielectric layer, resulting in a poor (e.g., uneven) feature profile and non-uniform feature sizes. In addition, the damage to the dielectric layer caused by the etching may decrease the mechanical strength of the dielectric layer, resulting in a collapse of the features during subsequent processes, for example, such as a subsequent metal fill to fill the features. Thus, the inventors have observed that removing the spacers 207 advantageously facilitates forming the features 222 without etching the porous dielectric layer 216, thus reducing or eliminating any damage to the porous dielectric layer 216 that would otherwise be caused by an etch process as described above. In addition, in some embodiments, the formation and subsequent removal of the spacers 207 may facilitate the formation of self-aligned vias (e.g., the extension of the features 222 to the barrier layer 206 as described below), advantageously eliminating the need for additional etch processes to form the via.

Figure 2F:
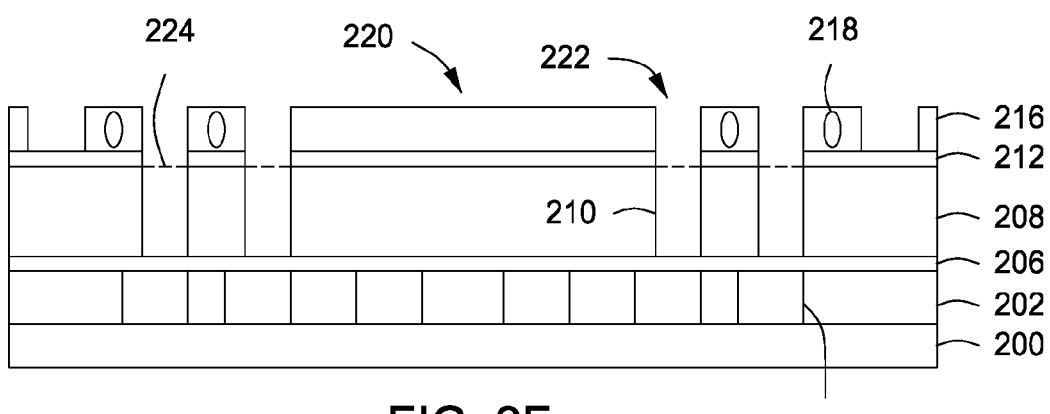

Next, at 112, the cap layer 212 may be etched to extend the features 222 through the cap layer 212, such as shown in FIG. 2F. Etching the cap layer 212, exposes at least a portion of the gap fill material 210, allowing a conductive material (e.g., a metal) to be deposited atop the gap fill material 210 in a subsequent metal fill process (e.g., a metal fill process such as described below). In some embodiments, for example, where the gap fill material 210 is a dielectric material, the etch may be performed to further etch the gap fill material 210 to extend the features 222 to the barrier layer 206 (such as shown in phantom at 224). The cap layer 212 may be etched via any suitable etch process that selectively etches the cap layer 212 while not etching the porous dielectric layer 216.

Figure 2G:
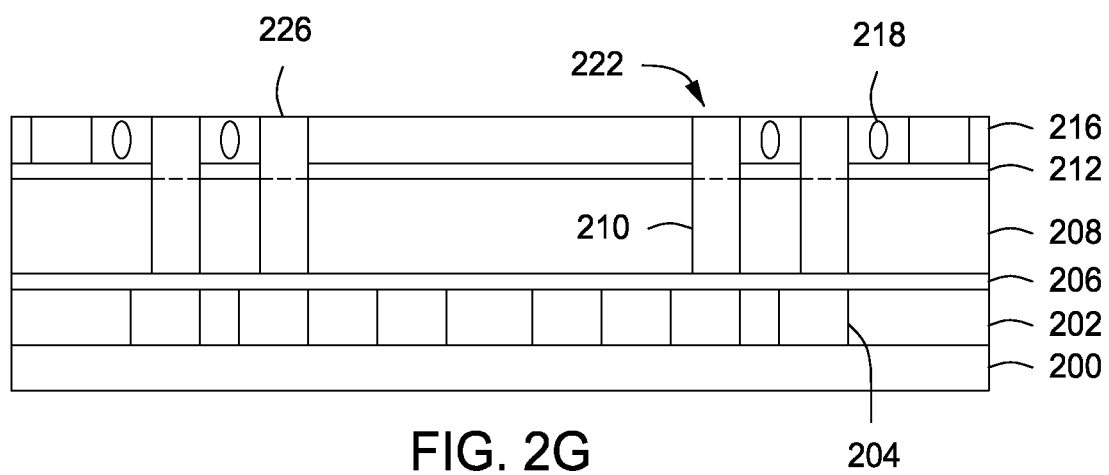

Next, at 114, the features 222 may be filled with a metal 226, such as shown in FIG. 2G. The inventors have observed that by filling the features 222 with the metal 226 after depositing the porous dielectric layer 216 and/or forming the one or more voids 218 in the porous dielectric layer 216 (e.g., a "metal last" process) reduces or eliminates degradation of the metal 226 that could otherwise be caused by depositing the porous dielectric layer 216 and/or forming the one or more voids 218 in the porous dielectric layer 216 subsequent to filling the features 222 with the metal 226.

The metal may be any metal sufficient to provide a desired conductive path through the feature 222 to the substrate 200 via the conductive layer 204 disposed within the low-k dielectric layer 202. For example, in some embodiments, the features 222 may be filled with a metal, for example, copper (Cu), tungsten (W), ruthenium (Ru), or the like. The features may be filled with the metal via any process suitable to deposit the desired metal, for example, a deposition process, such as physical vapor deposition (PVD), chemical vapor deposition (CVD), atomic layer deposition (ALD), or the like.

After the features 222 are filled at 114, the method 100 generally ends and the substrate 200 may proceed for further processing. For example, in some embodiments, subsequent processes such as deposition, etch, annealing, or the like may be performed to fabricate a finished device.

Figure 3:
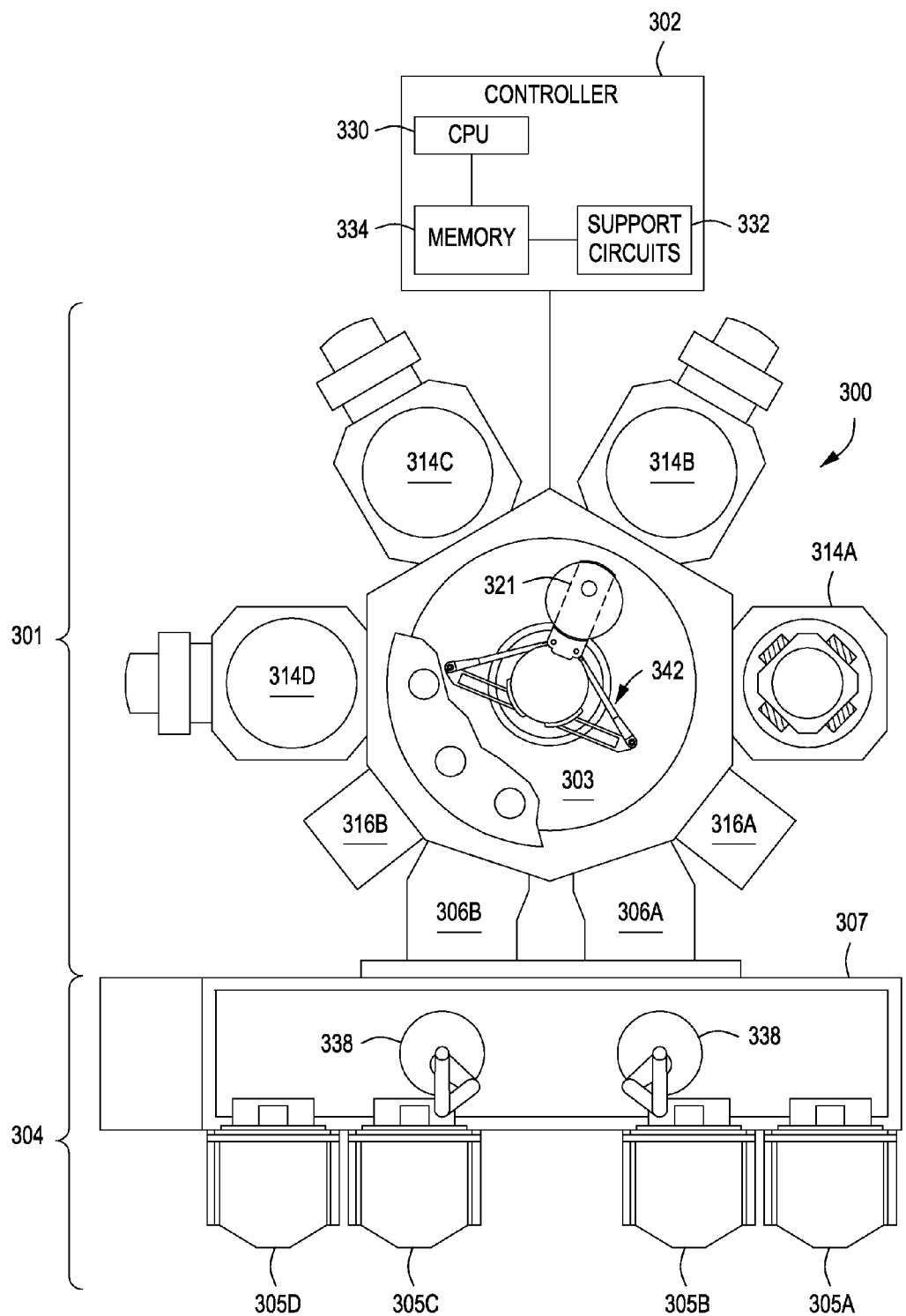
FIG. 3 depicts an integrated tool suitable for performing a method for forming an interconnect pattern atop a substrate in accordance with at least some embodiments of the present disclosure.

The methods described herein may be performed in individual process chambers that may be provided in a standalone configuration or as part of a cluster tool, for example, an integrated tool 300 (i.e., cluster tool) described below with respect to FIG. 3. Examples of the integrated tool 300 include the CENTURA®, PRODUCER® and ENDURA® integrated tools, available from Applied Materials, Inc., of Santa Clara, Calif. It is contemplated that the methods described herein may be practiced using other cluster tools having suitable process chambers coupled thereto, or in other suitable process chambers. For example, it may be advantageous in some embodiments to perform the inventive methods discussed above in an integrated tool such that there are limited or no vacuum breaks between processing steps. For example, reduced vacuum breaks may limit or prevent contamination of the seed layer or other portions of the substrate.

The integrated tool 300 includes a vacuum-tight processing platform 301, a factory interface 304, and a controller 302. The processing platform 301 comprises multiple processing chambers, such as 314A, 314B, 314C, and 314D operatively coupled to a transfer chamber 303. The factory interface 304 is operatively coupled to the transfer chamber 303 by one or more load lock chambers (two load lock chambers, such as 306A and 306B shown in FIG. 3).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 3. The factory interface robot 338 is configured to transfer the substrates from the factory interface 304 to the processing platform 301 through the loadlock chambers, such as 306A and 306B. Each of the load lock chambers 306A and 306B have a first port coupled to the factory interface 304 and a second port coupled to the transfer chamber 303. The load lock chamber 306A and 306B are coupled to a pressure control system (not shown) which pumps down and vents the load lock chambers 306A and 306B to facilitate passing the substrates between the vacuum environment of the transfer chamber 303 and the substantially ambient (e.g., atmospheric) environment of the factory interface 304. The transfer chamber 303 has a vacuum robot 342 disposed in the transfer chamber 303. The vacuum robot 342 is capable of transferring substrates 321 between the load lock chambers 306A and 306B and the processing chambers 314A, 314B, 314C, and 314D.

In some embodiments, the processing chambers 314A, 314B, 314C, and 314D, are coupled to the transfer chamber 303. The processing chambers 314A, 314B, 314C, and 314D may include any process chambers suitable to perform all or portions of the method 100 described above. For example, the processing chambers 314A, 314B, 314C, and 314D may include one or more etch chambers, deposition chambers, annealing chambers, or the like. In some embodiments, the processing chambers 314A, 314B, 314C, and 314D may include one or more of a HART™, E-MAX®, DPS®, DPS II, or ENABLER® etch chamber also available from Applied Materials, Inc.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

In some embodiments, one or more of the service chambers 316A, 316B may be configured to perform metrology for in-situ process control of each deposited film layer, including the etching of each deposited layer. In-situ process control may be performed following some or all of the process steps described above in method 100. For example, a substrate 200 as depicted in FIG. 2A may be transferred to a service chamber 316A, 316B to measure the critical dimension of features 205; or following 104, the substrate 200 as depicted in FIG. 2B may be transferred to a service chamber 316A, 316B to measure the thickness of the deposited porous dielectric layer 216; or following 110 the substrate 200 as depicted in FIG. 2E may be transferred to a service chamber 316A, 316B to measure the critical dimension of the features 222; or the like.

Metrology data may be provided to a controller to provide feed-forward and/or feedback control to adjust subsequent processes and/or to correct, for example, variations in the critical dimension and height of deposited layers. For example, the critical dimensions measurements of feature 205 may be used to produce control signals that are used at 104 to adjust the deposition of the porous dielectric layer as necessary. Alternatively or in combination, the critical dimensions measurements of feature 222 may be used at 114 to optimize the deposition of a metal 226 to fill the feature.

The controller 302 controls the operation of the tool 300 using a direct control of the process chambers 314A, 314B, 314C, and 314D or alternatively, by controlling the computers (or controllers) associated with the process chambers 314A, 314B, 314C, and 314D and the tool 300. In operation, the controller 302 enables data collection and feedback from the respective chambers and systems to optimize performance of the tool 300. The controller 302 generally includes a Central Processing Unit (CPU) 330, a memory 334 (e.g., a computer readable medium), and a support circuit 332. The CPU 330 may be one of any form of a general purpose computer processor that can be used in an industrial setting. The support circuit 332 is conventionally coupled to the CPU 330 and may comprise a cache, clock circuits, input/output subsystems, power supplies, and the like. Software routines, such as the methods described above may be stored in the memory 334 and, when executed by the CPU 330, transform the CPU 330 into a specific purpose computer (controller) 302 to control the integrated tool 300 to perform the method 100 as described above. The software routines may also be stored and/or executed by a second controller (not shown) that is located remotely from the tool 300.

Thus, methods for forming interconnect patterns atop a substrate have been provided herein. In at least some embodiments, the inventive method may advantageously facilitate the formation of features within a porous dielectric layer while not causing damage to the porous dielectric layer.

While the foregoing is directed to embodiments of the present disclosure, other and further embodiments of the disclosure may be devised without departing from the basic scope thereof.

The invention claimed is:

1. A method for forming an interconnect pattern atop a substrate, comprising:
    depositing a porous dielectric layer atop a cap layer and a plurality of spacers disposed atop the cap layer, wherein the cap layer is disposed atop a bulk dielectric layer and the bulk dielectric layer is disposed atop a substrate;
    selectively depositing a photoresist layer atop an area of the porous dielectric layer where no features are to be formed in the porous dielectric layer;
    subsequently removing a portion of the porous dielectric layer;
    removing the plurality of spacers to form features in the porous dielectric layer; and
    etching the cap layer to extend the features through the cap layer.

2. The method of claim 1, further comprising:
    filling the features with a metal after etching the cap layer.

3. The method of claim 1, wherein the substrate further comprises a barrier layer disposed beneath the bulk dielectric layer.

4. The method of claim 3, wherein the substrate further comprises a dielectric layer disposed beneath the barrier layer, wherein the dielectric layer comprises second features formed in the dielectric layer that are filled with a conductive material.

5. The method of claim 4, wherein the features formed in the porous dielectric layer are aligned with, and disposed above, the second features formed in the dielectric layer.

6. The method of claim 1, wherein the bulk dielectric layer comprises third features formed in the bulk dielectric layer that are filled with a metal containing material, a silicon containing material or a carbon containing material.

7. The method of claim 6, wherein the method further comprises:
    removing the silicon containing material from the bulk dielectric layer to extend the features through the bulk dielectric layer.

8. The method of claim 1, wherein depositing the porous dielectric layer comprises depositing the porous dielectric layer such that one or more voids are formed within the porous dielectric layer.

9. The method of claim 1, further comprising:
    removing the photoresist layer while removing the portion of the porous dielectric layer.

10. A method for forming an interconnect pattern atop a substrate, comprising:
    depositing a porous dielectric layer atop a cap layer and a plurality of spacers disposed atop the cap layer such that one or more voids are formed within the porous dielectric layer, wherein the cap layer is disposed atop a bulk dielectric layer and the bulk dielectric layer is disposed atop a substrate;
    selectively depositing a photoresist layer atop the porous dielectric layer atop an area of the porous dielectric layer where no features are to be formed in the porous dielectric layer;
    removing a portion of the porous dielectric layer through the photoresist layer;
    removing the plurality of spacers to form features in the porous dielectric layer; and
    etching the cap layer to extend the features through the cap layer.

11. The method of claim 10, wherein the substrate further comprises a barrier layer disposed beneath the bulk dielectric layer, and a dielectric layer disposed beneath the barrier layer, wherein the dielectric layer comprises second features formed in the dielectric layer that are filled with a conductive material, and wherein the features formed in the porous dielectric layer are aligned with, and disposed above, the second features formed in the dielectric layer.

12. The method of claim 11, further comprising:
    filling the features with a metal after etching the cap layer.

13. The method of claim 10, further comprising:
    removing the photoresist layer while removing the portion of the porous dielectric layer.

14. A computer readable medium, having instructions stored thereon that, when executed, cause a method for etching features into a substrate to be performed, the method comprising:
    depositing a porous dielectric layer atop a cap layer and a plurality of spacers disposed atop the cap layer, wherein the cap layer is disposed atop a bulk dielectric layer and the bulk dielectric layer is disposed atop a substrate;

selectively depositing a photoresist layer atop an area of the porous dielectric layer where no features are to be formed in the porous dielectric layer;

subsequently removing a portion of the porous dielectric layer;

removing the plurality of spacers to form features in the porous dielectric layer; and etching the cap layer to extend the features through the cap layer.

15. The computer readable medium of claim 14, wherein the method further comprises:

filling the features with a metal after etching the cap layer.

16. The computer readable medium of claim 14, wherein the bulk dielectric layer comprises third features formed in the bulk dielectric layer that are filled with a metal containing material, a silicon containing material or a carbon containing material, and wherein the method further comprises:

removing the silicon containing material from the bulk dielectric layer to extend the features through the bulk dielectric layer.

17. The computer readable medium of claim 14, wherein the method further comprises depositing the porous dielectric layer such that one or more voids are formed within the porous dielectric layer.

18. The computer readable medium of claim 14, wherein the method further comprises:

removing the photoresist layer while removing the portion of the porous dielectric layer.

\* \* \* \* \*